(12) United States Patent
Zihir et al.

(10) Patent No.: US 11,171,427 B2
(45) Date of Patent: *Nov. 9, 2021

(54) FRONT-END CHIP FOR DUAL-POLE ANTENNA ARRAY

(71) Applicant: Integrated Device Technology, Inc., San Jose, CA (US)

(72) Inventors: Samet Zihir, San Diego, CA (US); Tumay Kanar, San Diego, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 94 days.

This patent is subject to a terminal disclaimer.

(21) Appl. No.: 16/747,054

(22) Filed: Jan. 20, 2020

(65) Prior Publication Data

US 2020/0153112 A1 May 14, 2020

Related U.S. Application Data

(63) Continuation of application No. 16/050,112, filed on Jul. 31, 2018, now Pat. No. 10,587,052.

(Continued)

(51) Int. Cl.
*H01Q 21/00* (2006.01)
*H01Q 21/06* (2006.01)
(Continued)

(52) U.S. Cl.
CPC ....... *H01Q 21/0006* (2013.01); *H01Q 1/2283* (2013.01); *H01Q 1/48* (2013.01);
(Continued)

(58) Field of Classification Search
CPC ........ H01Q 19/30; H01Q 1/2283; H01Q 1/48; H01Q 1/523; H01Q 1/526; H01Q 21/0006; H01Q 21/0025; H01Q 21/062; H01Q 21/065; H01Q 3/28; H01Q 3/36; H03F 1/3282; H03F 2200/387; H03F 2200/451; H03F 3/195; H03G 3/3042; H03H 7/487;
(Continued)

(56) References Cited

U.S. PATENT DOCUMENTS

3,255,450 A * 6/1966 Butler .................. H01Q 3/40
342/373
3,295,134 A 12/1966 Lowe ......................... 342/368
(Continued)

*Primary Examiner* — Tho G Phan
(74) *Attorney, Agent, or Firm* — Christopher P. Maiorana, PC (57) ABSTRACT

An apparatus includes a package and a beam former circuit. The package may be configured to be mounted on an antenna array at a center of four antenna elements. Each antenna element may include a dual-pole antenna having a vertical feed and a horizontal feed. The beam former circuit may be (i) disposed in the package, (ii) have a plurality of pairs of ports, (iii) configured to generate a plurality of radio-frequency signals in the ports while in a transmit mode and (iv) configured to receive the radio-frequency signals at the ports while in a receive mode. Each pair of the ports is configured to be directly connected to a respective one of the antenna elements. All of the ports may be spatially routed into alignment with the vertical feeds and the horizontal feeds in a single conductive plane of the antenna array.

20 Claims, 8 Drawing Sheets

Related U.S. Application Data (60) Provisional application No. 62/559,875, filed on Sep. 18, 2017, provisional application No. 62/560,173, filed on Sep. 18, 2017.

(51) Int. Cl.

| | | |
|---|---|---|
| *H04B 1/44* | (2006.01) | |
| *H03F 1/56* | (2006.01) | |
| *H03F 3/19* | (2006.01) | |
| *H03G 3/30* | (2006.01) | |
| *H03F 3/24* | (2006.01) | |
| *H03F 1/32* | (2006.01) | |
| *H03F 3/195* | (2006.01) | |
| *H03F 3/45* | (2006.01) | |
| *H03F 3/68* | (2006.01) | |
| *H04B 1/04* | (2006.01) | |
| *H04B 1/18* | (2006.01) | |
| *H04B 1/48* | (2006.01) | |
| *H03K 21/10* | (2006.01) | |
| *H04B 7/06* | (2006.01) | |
| *H01Q 1/52* | (2006.01) | |
| *H01Q 3/28* | (2006.01) | |
| *H01Q 3/36* | (2006.01) | |
| *H01Q 19/30* | (2006.01) | |
| *H03F 1/02* | (2006.01) | |
| *H01Q 1/48* | (2006.01) | |
| *H01Q 1/22* | (2006.01) | |
| *H03H 7/48* | (2006.01) | |
| *H04B 1/401* | (2015.01) | |

(52) U.S. Cl.
CPC .............. *H01Q 1/523* (2013.01); *H01Q 1/526* (2013.01); *H01Q 3/28* (2013.01); *H01Q 3/36* (2013.01); *H01Q 19/30* (2013.01); *H01Q 21/0025* (2013.01); *H01Q 21/062* (2013.01); *H01Q 21/065* (2013.01); *H03F 1/0211* (2013.01); *H03F 1/0261* (2013.01); *H03F 1/3282* (2013.01); *H03F 1/565* (2013.01); *H03F 3/19* (2013.01); *H03F 3/195* (2013.01); *H03F 3/245* (2013.01); *H03F 3/45089* (2013.01); *H03F 3/45475* (2013.01); *H03F 3/68* (2013.01); *H03G 3/3042* (2013.01); *H03H 7/487* (2013.01); *H03K 21/10* (2013.01); *H04B 1/0458* (2013.01); *H04B 1/18* (2013.01); *H04B 1/401* (2013.01); *H04B 1/44* (2013.01); *H04B 1/48* (2013.01); *H04B 7/0617* (2013.01); *H03F 2200/294* (2013.01); *H03F 2200/387* (2013.01); *H03F 2200/451* (2013.01)

(58) Field of Classification Search
CPC .......... H04B 1/0458; H04B 1/18; H04B 1/48; H04B 7/0617
See application file for complete search history.

(56) References Cited

U.S. PATENT DOCUMENTS

| | | | |
|---|---|---|---|
| 4,626,858 A | 12/1986 | Copeland | 342/363 |
| 5,532,706 A | 7/1996 | Reinhart | 333/21 A |
| 6,680,698 B2 | 1/2004 | Eiges | |
| 7,538,740 B2 | 5/2009 | Korisch | 343/844 |
| 8,098,198 B2 | 1/2012 | Thiesen | 342/372 |
| 9,537,224 B2* | 1/2017 | Friedman | H04B 7/04 |
| 10,116,065 B2* | 10/2018 | Pan | H04B 7/10 |
| 10,587,052 B2* | 3/2020 | Zihir | H01Q 3/36 |
| 10,727,580 B2* | 7/2020 | Rajagopalan | H01Q 9/045 |
| 10,804,616 B2* | 10/2020 | Buer | H01Q 3/2605 |
| 10,826,197 B2* | 11/2020 | Yu | H01Q 25/001 |
| 2006/0284783 A1 | 12/2006 | Mohamadi | 343/853 |

* cited by examiner

FRONT-END CHIP FOR DUAL-POLE ANTENNA ARRAY

This application relates to U.S. Ser. No. 16/050,112, filed Jul. 31, 2018, which relates to U.S. Provisional Application No. 62/559,875, filed Sep. 18, 2017 and U.S. Provisional Application No. 62/560,173, filed Sep. 18, 2017, each of which are hereby incorporated by reference in their entirety.

FIELD OF THE INVENTION

The invention relates to radio-frequency beam forming generally and, more particularly, to a method and/or apparatus for implementing a symmetrical front-end chip for a dual-pole antenna array.

BACKGROUND

Integrating patch antenna elements with conventional support electronics is becoming more difficult as packing densities increase. Long traces between transceiver channels and the patch antenna elements results in signal losses. Crossing traces between the transceiver channels and the patch antenna elements also cause coupling effects on the antenna feeds.

It would be desirable to implement a symmetrical front-end chip for a dual-pole antenna array.

SUMMARY

The invention concerns an apparatus including a package and a beam former circuit. The package may be configured to be mounted on an antenna array at a center of four antenna elements. Each antenna element may include a dual-pole antenna having a vertical feed and a horizontal feed. The beam former circuit may be (i) disposed in the package, (ii) have a plurality of pairs of ports, (iii) configured to generate a plurality of radio-frequency signals in the ports while in a transmit mode and (iv) configured to receive the radio-frequency signals at the ports while in a receive mode. Each pair of the ports is configured to be directly connected to a respective one of the antenna elements. All of the ports may be spatially routed into alignment with the vertical feeds and the horizontal feeds in a single conductive plane of the antenna array.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a symmetrical front-end chip for a dual-pole antenna array that may (i) reduce crosstalk coupling, (ii) reduce signal losses in traces, (iii) reduce power consumption, (iv) provide better thermal performance and/or (v) be implemented as one or more integrated circuits.

Embodiments of the invention generally provide a packaged beam former circuit of sufficient size to be mounted on a patch antenna array at a center of each set of multiple (e.g., four) antenna elements. Each antenna element may be a dual-pole antenna with a vertical feed and a horizontal feed. A design of the beam former circuit may include multiple transceiver channels, a horizontal transceiver channel and a vertical transceiver channel for each of the antenna elements. A layout of the beam former circuits and the antenna array generally allows for direct connections between each vertical feed and each horizontal feed of the antenna elements and respective vertical transceiver channels and respective horizontal transceiver channels. The layout may route all signal traces between the vertical/horizontal feeds and the vertical/horizontal transceiver channels on a single conductive layer of a printed circuit board of the antenna array.

Figure 1:
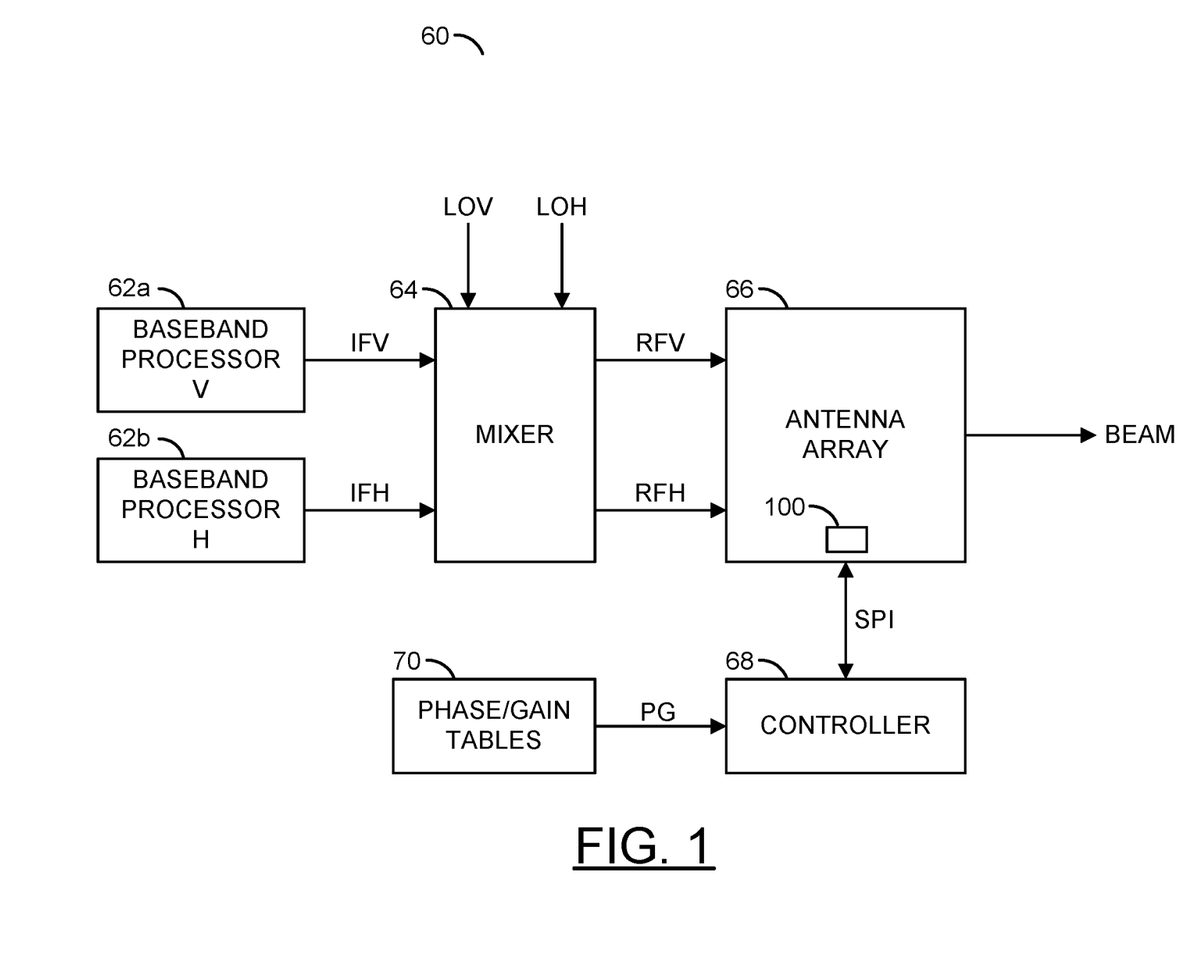
FIG. 1 is a diagram of a system illustrating a context of the invention.

Referring to FIG. 1, a block diagram of a system 60 illustrating a context of the invention is shown. The system (or module or circuit or apparatus) 60 may implement a radio-frequency (RF) transceiver system in accordance with an example embodiment of the invention. The RF transceiver system 60 may be configured to operate at common wireless radio frequencies, millimeter-wave frequencies, and/or microwave frequencies. In various embodiments, the RF transceiver system 60 may form part of a long range communications link. In various embodiments, the long range communications link may be part of a fifth generation (5G) wireless communications system (e.g., for which a standard is currently under development by the Next Generation Mobile Networks (NGMN) Alliance). In other embodiments, the long range communications link may be part of a fourth generation (4G) wireless communications system (e.g., International Mobile Telecommunications-Advanced (IMT-A) standard published by the International Telecommunications Unit Radiocommunication Sector (ITU-R)). However, other communications standards may be implemented to meet the design criteria of a particular application.

The RF transceiver system 60 generally comprises multiple blocks (or circuits) 62a-62b, a block (or circuit) 64, a block (or circuit) 66, a block (or circuit) 68 and a block (or circuit) 70. The circuit 66 generally comprises multiple blocks (or circuits) 100 (one shown for clarity). The circuits 62-100 may be implemented with hardware, a combination of hardware and software and/or simulated with software.

A signal (e.g., IFV) may be exchanged between the circuits 62a and the circuit 64. A signal (e.g., IFH) may be exchanged between the circuits 62b and the circuit 64. The signal IFV may implement an intermediate-frequency signal carrying information to be transmitted with a vertical polarization from and/or received by the RF transceiver system 60. The signal IFH may implement an intermediate-frequency signal carrying information to be transmitted with a horizontal polarization from and/or received by the RF transceiver system 60. Signals (e.g., LOV and LOH) may be received by the circuit 64. The signals LOV and LOH may implement local oscillator signals, one for each polarization. A signal (e.g., RFV) may be exchanged between the circuit 64 and the circuit 66. The signal RFV may be a radio-frequency signal that conveys the information also found in the intermediate-frequency signal IFV. A signal (e.g., RFH) may be exchanged between the circuit 64 and the circuit 66. The signal RFH may be a radio-frequency signal that conveys the information also found in the intermediate-frequency signal IFH. In a transmit mode, the radio-frequency signals RFV and RFH may convey information to broadcast from the circuit 66. In a receive mode, the radio-frequency signals RFV and RFH may convey information received by the circuit 66. A field (e.g., BEAM) may be generated by the circuit 66. The field BEAM may represent a field pattern (or a radio-frequency beam pattern) created by the circuit 66. A signal (e.g., SPI) may be exchanged between the circuit 66 and the circuit 68. The signal SPI may convey data, clocking and control elements. A signal (e.g., PG) may be transferred from the circuit 70 to the circuit 68. The signal PG may convey phase information and gain information used by the circuits 66 and 68 to control steering of the field BEAM.

Each circuit 62a-62b may implement a baseband processor circuit. The baseband processor circuits 62a-62b are generally operational to process the information sent by and/or received in the intermediate-frequency signals IFV and IFH. The baseband processor circuit 62a may process vertically polarized information in the RF transceiver system 60. The baseband processor circuit 62b may process horizontally polarized information in the RF transceiver system 60. The processing may include, but is not limited to, modulation/demodulation of the radio signal that contains the information and management of simultaneous communications between the RF transceiver system 60 and multiple remote terminals.

The circuit 64 may implement one or more mixer circuits. The mixer 64 is generally operational to frequency convert between an intermediate frequency used for the signals IFV and IFH and the radio frequency used for the signals RFV and RFH. The frequency conversion may be based on local oscillator frequencies of the local oscillator signals LOV and LOH. In various embodiments, each common radio-frequency signal RFV and RFH may be in a range of frequencies centered around approximately 28 gigahertz (GHz) or 39 GHz (e.g., 24 GHz to 30 GHz or 37 GHz to 44 GHz). Each intermediate frequency may cover a band from approximately 2 GHz to 6 GHz (e.g., an approximately 4 GHz bandwidth). Each local oscillator frequency may range from approximately 22 GHz to 26 GHz while the signals RFV and/or RFH are at 28 GHz. Each local oscillator frequency may range from approximately 33 GHz to 37 GHz while the signals RFV and/or RFH are at 39 GHz. Other frequency ranges may be implemented to meet the design criteria of a particular application.

The circuit 66 may implement a dual-pole antenna array. The antenna array 66 may be operational to transmit and receive wireless signals to and from devices (or terminals) remotely located from the RF transceiver system 60. Sensitivity to the wireless signals may be determined by the field BEAM created by the antenna array 66. The antenna array 66 may comprise a number (e.g., N) of antenna elements and a similar number of transceiver channels. The N transceiver channels may be coupled by the corresponding bidirectional radio-frequency signals to the N antenna elements. The transceiver channels and antenna elements generally form a two-dimensional antenna network. In various embodiments, the antenna array 66 may be implemented as a patch antenna or a phased array antenna.

The circuit 68 may implement a controller circuit. The controller 68 is generally operational to control the operations of the antenna array 66. In some embodiments, the controller 68 may determine the setting values used in each transceiver channel within the beam former circuit 66 to establish the geometry of the field BEAM. In various embodiments, the controller 68 may be implemented as one or more integrated circuits.

The circuit 70 may implement a table in a memory circuit. The table 70 may be configured to store multiple gain values and multiple phase values used by the transceiver channels in the antenna array 66 to establish the field BEAM. The phase values and the gain values may be loaded from the table 70 into buffers within antenna array 66 by the controller 68. In various embodiments, the memory storing the table 70 may be implemented on the same integrated circuit as the controller 68.

Each circuit 100 may implement a beam former circuit. The beam former circuits 100 are generally operational to multiplex/demultiplex the signals RFV and RFH with multiple antenna elements in the antenna array 66. The beam former circuit 100 may also be operational to control the shape, direction and magnitude of the field BEAM based on phase information and gain information received through the signal SPI.

Figure 2:
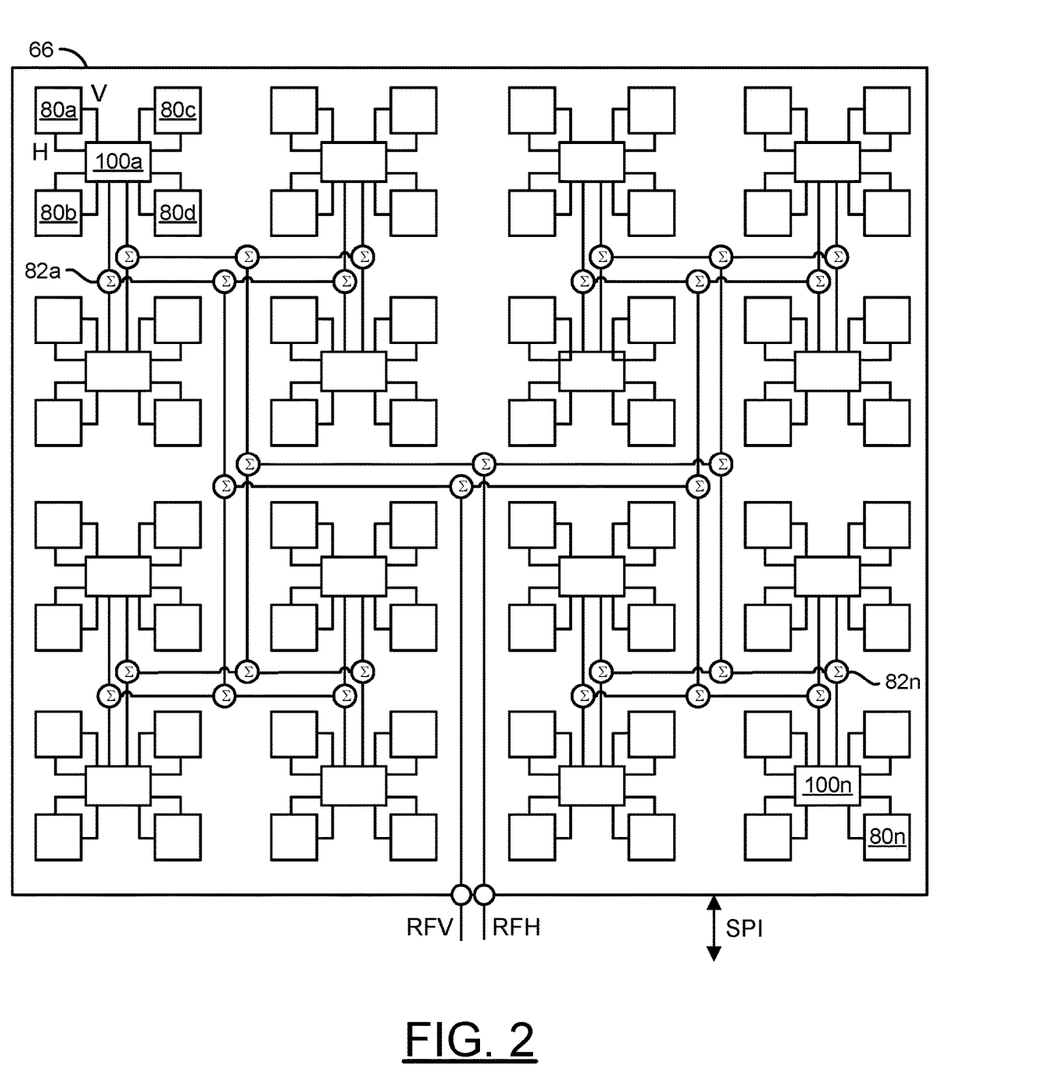
FIG. 2 is a diagram of an antenna array of the system in accordance with an embodiment of the invention.

Referring to FIG. 2, a diagram of an example implementation of the antenna array 66 is shown in accordance with an embodiment of the invention. The antenna array 66 generally comprises multiple blocks (or circuits) 80a-80n, multiple blocks (or circuits) 82a-82n and multiple blocks (or circuits) 100a-100n. The circuits 80a-100n may be implemented with hardware, a combination of hardware and software and/or simulated with software.

The signals RFV and RFH may be exchanged with two of the circuits 82a-82n. The signal SPI may be exchanged with all of the circuits 100a-100n.

Each circuit 80a-80n may implement an antenna element. The antenna elements 80a-80n in the antenna array 66 may be used for both transmission and reception. In various embodiments, each antenna element 80a-80n may be implemented as a dual-pole antenna. A physical positioning of the antenna elements 80a-80n generally provides a two-dimensional (e.g., horizontal and vertical) control of the field BEAM.

Each circuit 82a-82n may implement a combiner circuit. In various embodiments, each combiner circuit 82a-82n may be implemented as a Wilkinson combiner circuit. The combiner circuits 82a-82n may be arranged as two sets of combiner circuits, a set for routing of the signal RFV and another set for the routing of the signal RFH. In the transmit mode, the combiner circuits 82a-82n are generally operational to distribute the power in the common signals RFV and RFH to the circuits 100a-100n. In the receive mode, the combiner circuits 82a-82n may be operational to combine the power received in signals from the circuits 100a-100n into the signals RFV and RFH.

Each circuit 100a-100n may implement one of the beam former circuits 100. The beam former circuits 100a-100n are generally operational to multiplex/demultiplex the signals RFV and RFH with multiple (e.g., N) antenna elements 80a-80n. The beam former circuits 100a-100n may also be operational to change setting values rapidly (e.g., phase values and gain values) used by the transceiver channels to steer the field BEAM formed by the antenna array 66. In various embodiments, each beam former circuit 100*a*-100*n* may be implemented as one or more integrated circuits in a package. Each packed beam former circuit 100*a*-100*n* may be mounted on a substrate of the antenna array 66 at a center of four neighboring antenna elements 80*a*-80*n*.

Figure 3:
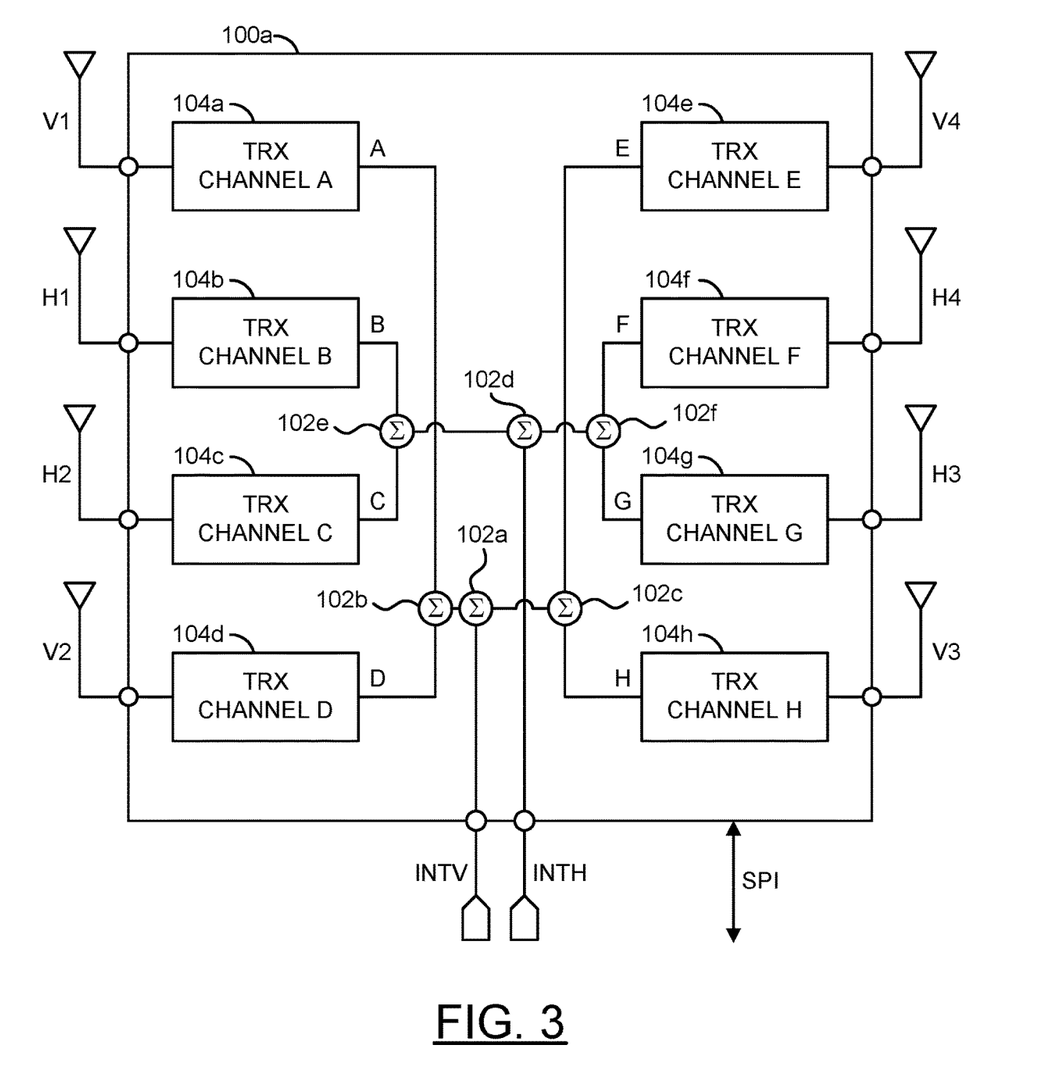
FIG. 3 is a diagram of a beam former circuit of the antenna array in accordance with an embodiment of the invention.

Referring to FIG. 3, a diagram of an example implementation of a beam former circuit 100*a* is shown in accordance with an embodiment of the invention. The beam former circuit 100*a* may be representative of each beam former circuit 100*a*-100*n*. The beam former circuit 100*a* generally comprises multiple blocks (or circuits) 102*a*-102*f* and multiple blocks (or circuit) 104*a*-104*h*. The circuits 102*a*-104*h* may be implemented with hardware, a combination of hardware and software and/or simulated with software.

A signal (e.g., INTV) may be exchanged with a circuit 102*a*. The signal INTV may represent an intermediate version of the signal RFV. The signal INTV and the signal RFV may be related through the combiner circuits 82*a*-82*n*. A signal (e.g., INTH) may be exchanged with a circuit 102*d*. The signal INTV may represent an intermediate version of the signal RFH. The signal INTH and the signal RFH may be related through the combiner circuits 82*a*-82*n*. Multiple signals (e.g., A-H) may be exchanged among the circuits 104*a*-104*h* and the circuits 102*b*, 102*c*, 102*e* and 102*f*. In a transmit mode, the signals A-H may be radio-frequency signals to be amplified by the circuits 104*a*-104*h*. In a receive mode, the signals A-H may be received radio-frequency signals amplified by the circuits 104*a*-104*h*. Multiple signals (e.g., V1-V4 and H1-H4) may be exchanged among the antenna elements 80*a*-80*n* (e.g., 80*a*-80*d*) and the circuits 104*a*-104*h*. In the transmit mode, the signals V1-H4 may be outgoing radio-frequency signals being broadcasted by the antenna array 66. In the receive mode, the signals V1-H4 may be incoming radio-frequency signals received by the antenna array 66.

Each circuit 102*a*-102*f* may implement a combiner circuit. In various embodiments, each combiner circuit 102*a*-102*f* may be implemented as a Wilkinson combiner circuit. The combiner circuits 102*a*-102*f* may be arranged as two sets of combiner circuits, a set for routing of the common signal INTV and another set for the routing of the common signal INTH. For example, the combiner circuits 102*a*-102*c* may route the signal INTV to and from the signals A, D, E and H. The combiner circuits 102*d*-102*f* may route the signal INTV to and from the signals B, C, F and G. In the transmit mode, the combiner circuits 102*a*-102*f* are generally operational to distribute the power in the common signals INTV and INTH to the circuits 104*a*-104*h*. In the receive mode, the combiner circuits 102*a*-102*f* may be operational to combine the power received in signals A-H from the circuits 104*a*-104*h* into the common signals INTV and INTH.

Each circuit 104*a*-104*h* may implement a transceiver (TRX) channel circuit. In the transmit mode, the transceiver channel circuits 104*a*-104*h* are generally operational to amplify the signals A-H received from the combiner circuits 102*a*-102*f* to generate the radio-frequency signals V1-V4 and H1-H4. In the receive mode, the transceiver channel circuits 104*a*-104*h* may be operational to amplify the radio-frequency signals V1-H4 and present the amplified signals back to the combiner circuits 102*a*-102*f*. The phase values and the gain values used by the transceiver channel circuits 104*a*-104*h* may be loaded from the table 70 via the controller 68 and the signal SPI. The phase values and the gain values may be used to adjust the phases and the amplitudes of the radio-frequency signals to steer the field BEAM Referring to FIG. 4, a diagram of another example implementation of a beam former circuit 100'*a* is shown in accordance with an embodiment of the invention. The beam former circuit 100'*a* may be a variation of the beam former circuit 100*a*. The beam former circuit 100'*a* may be representative of each beam former circuit 100*a*-100*n*. The beam former circuit 100'*a* generally comprises multiple blocks (or circuits) 102*g*-102*l* and the transceiver channel circuits 104*a*-104*h*. The circuits 102*g*-104*h* may be implemented with hardware, a combination of hardware and software and/or simulated with software.

Figure 4:
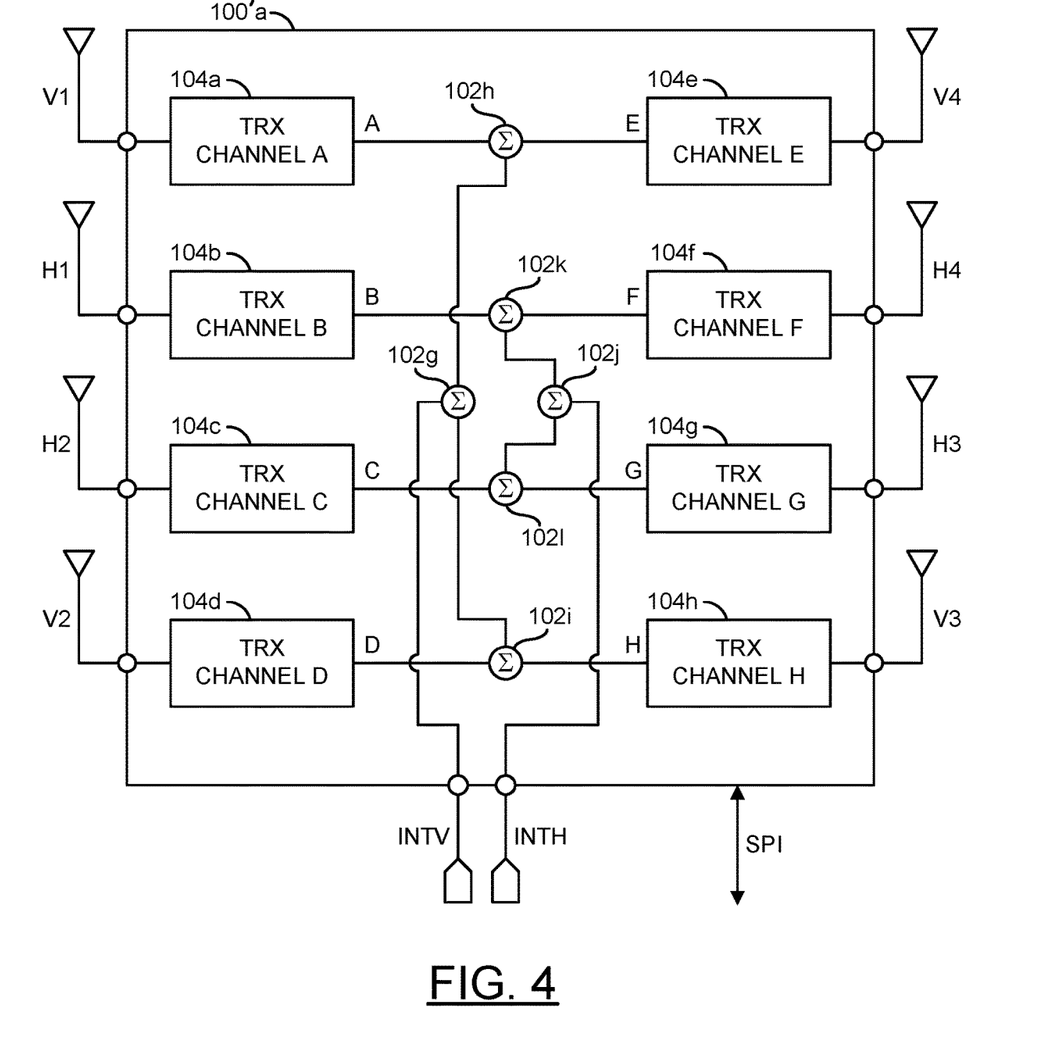
FIG. 4 is a diagram of another beam former circuit in accordance with an embodiment of the invention.

The INTV may be exchanged with the circuit 102*g*. The signal INT may be exchanged with the circuit 102*j*. Multiple signals (e.g., A-H) may be exchanged among the circuits 104*a*-104*h* and the circuits 102*h*, 102*k*, 102*l* and 102*i*. In a transmit mode, the signals A-H may be radio-frequency signals to be amplified by the circuits 104*a*-104*h*. In a receive mode, the signals A-H may be received radio-frequency signals amplified by the circuits 104*a*-104*h*. Multiple signals (e.g., V1-V4 and H1-H4) may be exchanged among the antenna elements 80*a*-80*n* (e.g., 80*a*-80*d*) and the circuits 104*a*-104*h*. In the transmit mode, the signals V1-H4 may be outgoing radio-frequency signals being broadcasted by the antenna array 66. In the receive mode, the signals V1-H4 may be incoming radio-frequency signals received by the antenna array 66.

Each circuit 102*g*-102*l* may implement a combiner circuit. In various embodiments, each combiner circuit 102*g*-102*l* may be implemented as a Wilkinson combiner circuit. The combiner circuits 102*g*-102*l* may be arranged as two sets of combiner circuits, a set for routing of the common signal INTV and another set for the routing of the common signal INTH. For example, the combiner circuits 102*g*-102*i* may route the signal INTV to and from the signals A, D, E and H. The combiner circuits 102*j*-102*l* may route the signal INTV to and from the signals B, C, F and G. In the transmit mode, the combiner circuits 102*g*-102*l* are generally operational to distribute the power in the common signals INTV and INTH to the circuits 104*a*-104*h*. In the receive mode, the combiner circuits 102*g*-102*l* may be operational to combine the power received in signals A-H from the circuits 104*a*-104*h* into the common signals INTV and INTH.

Figure 5:
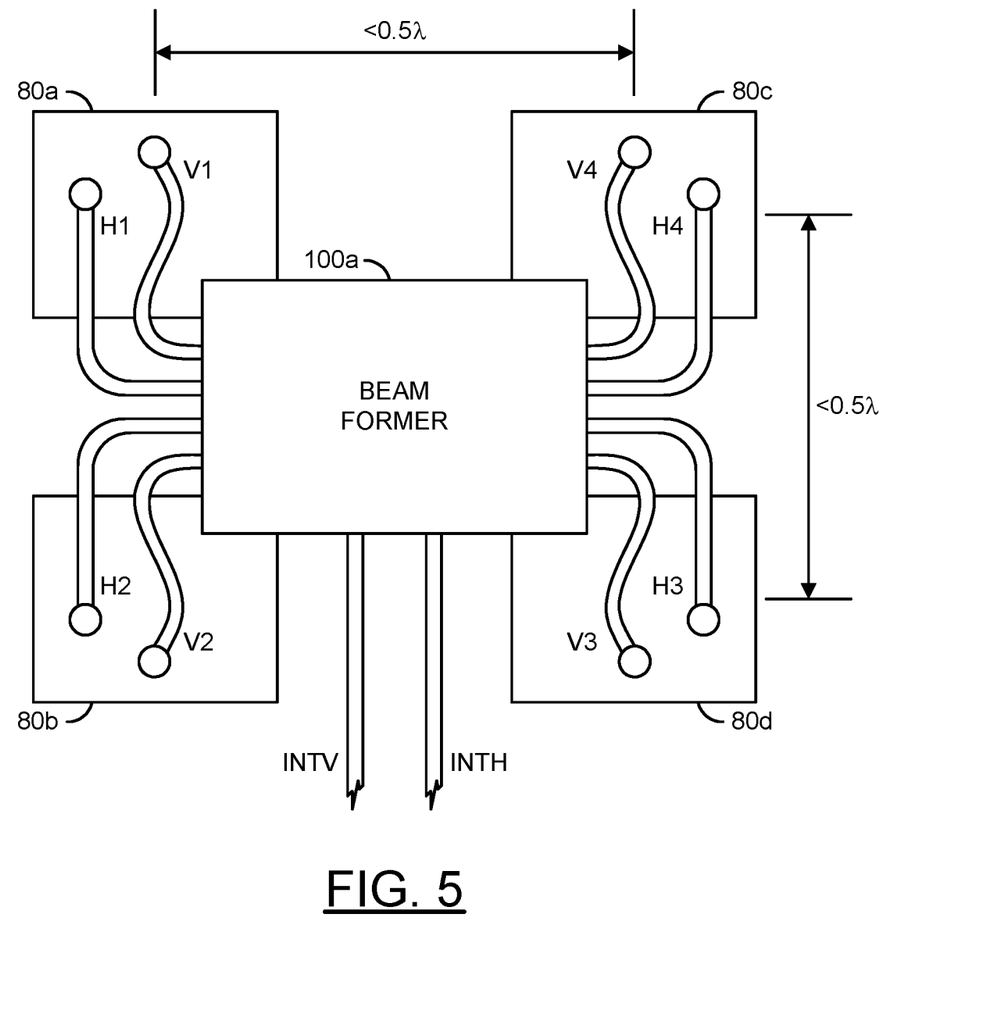
FIG. 5 is a layout diagram of the beam former circuit and neighboring antenna elements in accordance with an embodiment of the invention.

Referring to FIG. 5, a diagram of an example layout of the beam former circuit 100*a* and neighboring antenna elements 80*a*-80*d* is shown in accordance with an embodiment of the invention. The beam former circuit 100*a* may be representative of the beam former circuits 100*a*-100*n*. The set of quad antenna elements 80*a*-80*d* may be representative of the antennal elements 80*a*-80*n*. The antenna elements 80*a*-80*d* are generally spaced apart from each other by less than a half-wavelength (e.g., less than 5 millimeters (mm)) in both a horizontal direction and a vertical direction. In various embodiments for a dual-polarization implementation, the packaged beam former circuit 100*a* may also have dimensions of less than a half-wavelength (e.g., 3.3 mm by 4.8 mm) in both a horizontal direction and a vertical direction. In other embodiments for single-polarization implementation, the packaged beam former circuit 100*a* may have a smaller footprint (e.g., 3.36 mm by 3.5 mm). Each beam former circuit 100*a*-100*n* (e.g., 100*a* shown) may be mounted on a substrate of the antenna array 66 at a center of four neighboring antenna elements 80*a*-80*n* (e.g., 80*a*-80*d* shown).

Traces in a single conductive (e.g., metal) layer of the substrate may spatially route signals into alignment between the beam former circuits 100*a*-100*n* to the antenna elements 80*a*-80*n*. For example, the single conductive layer may be the layer adjoining input/output pads of the beam former circuit 100a-100n. The traces may remain in the single conductive layer until aligned with the input/output pads of the antenna elements 80a-80n. Through-substrate vias may provide connections from the traces to the antenna elements 80a-80n.

In some embodiments, each antenna element 80a-80n may be connected to a corresponding beam former circuit 100a-100n with two traces/through-substrate vias. One of the two traces/vias may convey a horizontally-polarized signal (e.g., H1-H4 shown). Another trace/via may convey a vertically-polarized signal (e.g., V1-V4 shown). The traces in the single conductive layer of the substrate may also directly connect the beam former circuits 100a-100n to the combiner circuits 82a-82n (see FIG. 2). In various embodiments, each beam former circuit 100a-100n may be directly connected by two traces to two corresponding combiner circuits 82a-82n. For example, a trace may carry the signals INTV. Another trace may carry the signals INTH. The small package size may provide reduced power consumption compared with common designs. The reduced power consumption may provide better thermal performance compared with common designs.

Implementing the VH-HV configuration generally minimizes the loss and possible crossovers. Having lower loss in the antenna interface may improve a receive gain and/or a transmit gain. The lower loss may improve a total gain budget multiple (e.g., 2) times, once on the receiving side and once on the transmitting side in configurations where two of the panels are used in a transmit receive communication system. The lower loss may provide flexibility for the beam former circuits 100a-100n to utilize a lower output power that is saved from the connection. The lower output power generally means lower power consumption and better thermal consumption. Up to a few (e.g., 1-2) decibels improvement may result in a modest (e.g., 20-30%) power consumption improvement and a relative thermal performance improvement. The same may apply for the receive mode and lower power consumption to achieve relaxed 5G New Radio specification criteria.

Figure 6:
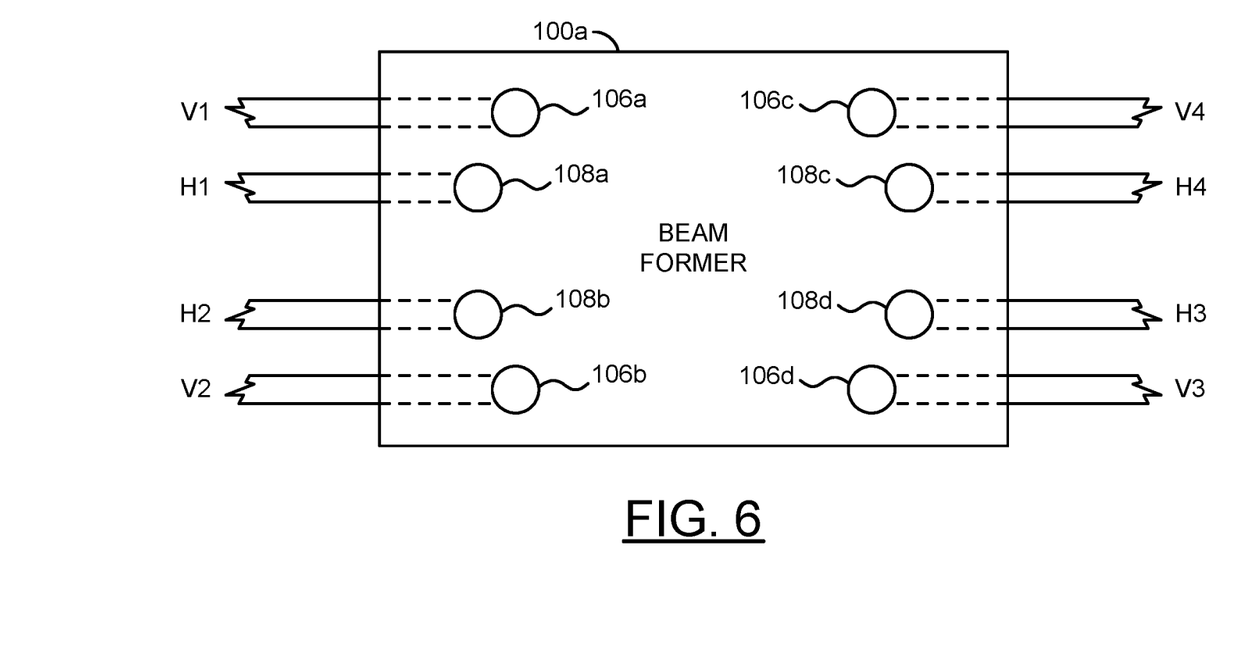
FIG. 6 is a layout diagram of a substrate side of the beam former circuit accordance with an embodiment of the invention.

Referring to FIG. 6, a diagram of an example layout of a substrate side of a beam former circuit 100a is shown in accordance with an embodiment of the invention. The beam former circuit 100a may be representative of all beam former circuits 100a-100n. Each beam former circuit 100a-100n (e.g., 100a is shown), may include multiple (e.g., 4) ports (or interfaces 106a-106d for the vertically-polarized signals V1-V4. Each beam former circuit 100a-100n may include multiple (e.g., 4) ports (or interfaces 108a-108d for the horizontally-polarized signals H1-H4. The ports 106a-106d and 108a-108d may be organized in pairs (e.g., 106a+108a, 106b+108b, 106c+108c and 106d+108d), a pair for each respective neighboring antenna element 80a-80d. A pair of ports 106a-106d and 108a-108d may be located in each corner of the package of the beam former circuits 100a-100n. The corner placements generally allow the traces that connect the ports 106a-106d and 108a-108d to the antenna elements 80a-80d to be directly routed in the single conductive layer without crossing over each other. The direct routing may reduce crosstalk coupling and minimize signal losses in the traces. Reducing the crossovers may simplify the substrate design and the substrate stackups thereby lowering the cost. Reducing the crosstalk may relax the beam former specifications and may also eliminate the usage of additional circuitry to improve the crosstalk. Eliminating the additional circuitry generally lowers the beam former complexity and power consumption.

Figure 7:
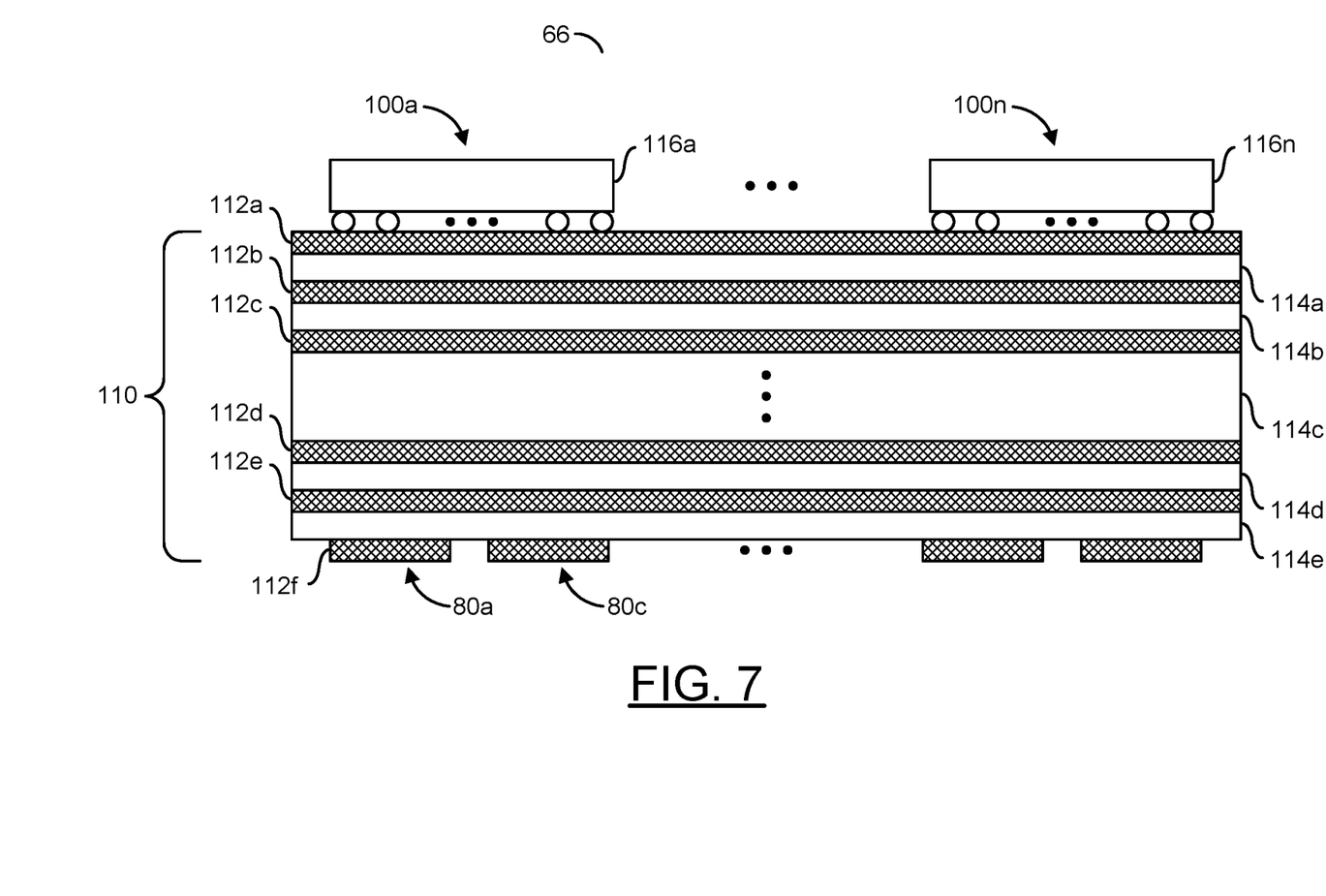
FIG. 7 is a cross-sectional diagram of the antenna array in accordance with an embodiment of the invention.

Referring to FIG. 7, a cross-sectional diagram of an example implementation of the antenna array 66 is shown in accordance with an embodiment of the invention. The antenna array generally comprises the antenna elements 80a-80n, the beam former circuits 100a-100n, and a substrate (or printed circuit board) 110. The substrate 110 generally comprises multiple layers 112a-112f and one or more layers 114a-114e. Each beam former circuit 100a-100n may be sealed in a respective protective package (or housing) 116a-116n.

The substrate 110 may be implemented as a printed circuit board. The substrate 110 generally provides mechanical support for the beam former circuits 100a-100n and the antenna elements 80a-80n. Traces on and through the substrate 110 may provide electrical connections between the antenna elements 80a-80n, the beam former circuits 100a-100n, connections to the controller 68, and connections to the mixer 64.

Each layer 112a-112f may be implemented as a conductive (or metal) layer. The conductive layers 112a-112f may provide the traces that interconnect the antenna elements 80a-80n and the beam former circuits 100a-100b. One or more of the conductive layers 112a-112f may provide the electrical connections to the controller 68 and the mixer 64. Inter-layer vias may be provided between the conductive layers 112a-112f to achieve layer-to-layer connections.

Each layer 114a-114f may be implemented as an insulating layer. The insulating layers 114a-114f generally provide electrical isolation between the conductive layers 112a-112f. The insulating layers 114a-114f may also provide for mechanical stiffness.

The beam former circuits 100a-100n may be mounted on a side of the substrate 110 (e.g., a top side as oriented in the figure). The antenna elements 80a-80n may be formed in one or more outer conductive layers (e.g., 112f) on a side of the substrate 110 opposite the beam former circuits 100a-100n (e.g., a bottom side as oriented in the figure). Feeds through the substrate 110 may be used to electrically connect the ports 106a-106d and 108a-108d to the antenna elements 80a-80n.

Figure 8:
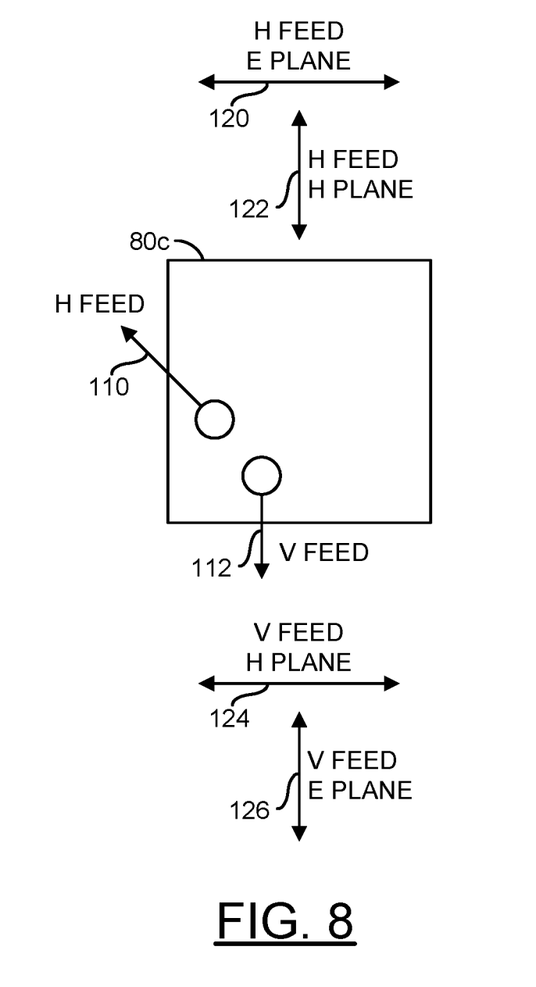
FIG. 8 is a layout diagram of a top side of an antenna element in accordance with an embodiment of the invention.

Referring to FIG. 8, a diagram of an example layout of a top side of an antenna element 80c is shown in accordance with an embodiment of the invention. The antenna element 80c generally comprises two feeds 110 and 112. The feed 110 may implement a horizontal feed. The horizontal feed 110 is generally coupled to a horizontally-polarized port 108a-108d of a neighboring beam former circuit 100a-100n. The feed 112 may implement a vertical feed. The vertical feed 112 is generally coupled to a horizontally-polarized port 106a-106d of a neighboring beam former circuit 100a-100n.

The antenna element 80c may be sensitive along a horizontal electrical (E) plane 120 and a vertical magnetic (H) plane 122. The electrical plane 120 and the magnetic plane 122 may be coupled to the horizontal feed 110. The antenna element 80 may be sensitive along a horizontal magnetic (H) plane 124 and a vertical electric (E) plane 126. The magnetic plane 124 and the electric plane 126 may be coupled to the horizontal feed 112.

To minimize the coupling between the V-planes and the H-planes of each antenna element 80a-80n, the V-plane feed lines and the H-plane feed lines may be electrically and/or physically isolated. Any cross-overs and/or proximity between the lines may lower the isolation. Various embodiments of the invention may eliminate the cross-overs. Some embodiments may also maximize the distance between the feed lines. The isolation generally improves the unwanted coupling between the V-planes and the H-planes and minimizes the leakage of electromagnetic waves between the feeds.

Although embodiments of the invention have been described in the context of a fifth-generation (5G) application, the present invention is not limited to 5G applications, but may also be applied in other high data rate wireless and wired communications applications where different rapid switching, multiple channel, and multiple user issues may exist. The present invention addresses concerns related to high speed wireless communications, mobile and stationary transceivers and point-to-point links. Future generations of wireless communications applications using radio-frequency (RF), microwave, and millimeter-wave links can be expected to provide increasing speed, increasing flexibility, and increasing numbers of interconnections and layers. The present invention may also be applicable to wireless communications systems implemented in compliance with either existing (legacy, 2G, 3G, 4G) specifications or future specifications.

The functions and structures illustrated in the diagrams of FIGS. 1 to 8 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a plurality of pairs of ports each (i) configured to be directly connected to one of a plurality of antenna elements and (ii) spatially routed into alignment with vertical feeds and horizontal feeds in a single conductive plane of an antenna array; and
a plurality of transceiver channels (i) configured as (a) a set of horizontal transceiver channels for said horizontal feeds and (b) a set of vertical transceiver channels for said vertical feeds and (ii) configured to (a) generate a plurality of radio-frequency signals in said plurality of pairs of ports while in a transmit mode and (b) receive said radio-frequency signals at said plurality of pairs of ports while in a receive mode.

2. The apparatus according to claim 1, wherein (i) said apparatus is disposed in a package, (ii) said package is configured to be mounted on said antenna array at a center of said plurality of antenna elements and (iii) each of said plurality of antenna elements comprise a dual-pole antenna.

3. The apparatus according to claim 2, wherein said package comprises (i) a first dimension less than a half-wavelength of said radio-frequency signals and (ii) a second dimension less than said half-wavelength of said radio-frequency signals.

4. The apparatus according to claim 3, wherein said half-wavelength is approximately 5 millimeters.

5. The apparatus according to claim 1, further comprising (i) a plurality of first combiner circuits configured to route a first signal among said vertical transceiver channels and (ii) a plurality of second combiner circuits configured to route a second signal among said horizontal transceiver channels.

6. The apparatus according to claim 1, further configured to adjust a plurality of phases and a plurality of amplitudes of said radio-frequency signals to steer a radio-frequency beam.

7. The apparatus according to claim 6, wherein (i) said radio-frequency beam has a frequency in a range of 24 gigahertz to 44 gigahertz and (ii) said apparatus is configured to implement part of a fifth generation wireless communications system.

8. An apparatus comprising:
a package configured to be mounted at a center of four antenna elements, wherein each of said antenna elements comprises a dual-pole antenna having a vertical feed and a horizontal feed; and
a beam former circuit (i) disposed in said package, (ii) having a plurality of ports, (iii) configured to generate a plurality of radio-frequency signals in said ports while in a transmit mode and (iv) configured to receive said radio-frequency signals at said ports while in a receive mode, wherein (a) each of said plurality of ports is placed on said package with a respective one other of said plurality of ports to form a plurality of pairs of ports, (b) said plurality of pairs of ports are each configured to be directly connected to a respective one of said antenna elements and (b) all of said ports are spatially routed into alignment with said vertical feeds and said horizontal feeds in a single conductive plane of said four antenna elements.

9. The apparatus according to claim 8, wherein said plurality of pairs of ports are symmetrically arranged around said package.

10. The apparatus according to claim 8, wherein (i) said apparatus comprises a plurality of said beam former circuits and (ii) said beam former circuits and said antenna elements are configured to implement part of a two-dimensional antenna network.

11. The apparatus according to claim 8, wherein said package comprises (i) a first dimension less than a half-wavelength of said radio-frequency signals and (ii) a second dimension less than said half-wavelength of said radio-frequency signals.

12. The apparatus according to claim 11, wherein said half-wavelength is approximately 5 millimeters.

13. The apparatus according to claim 8, wherein said beam former circuit comprises a plurality of transceiver channels configured as a set of horizontal transceiver channels and a set of vertical transceiver channels.

14. The apparatus according to claim 13, wherein said beam former circuit further comprises (i) a plurality of first combiner circuits configured to route a first signal among said vertical transceiver channels and (ii) a plurality of second combiner circuits configured to route a second signal among said horizontal transceiver channels.

15. The apparatus according to claim 8, wherein said beam former circuit is further configured to adjust a plurality of phases and a plurality of amplitudes of said radio-frequency signals to steer a radio-frequency beam.

16. The apparatus according to claim 15, wherein (i) said radio-frequency beam has a frequency in a range of 24 gigahertz to 44 gigahertz and (ii) said beam former circuit is configured to implement part of a fifth generation wireless communications system.

17. An apparatus comprising:
a package configured to be mounted on an antenna array at a center of four antenna elements, wherein each of said antenna elements comprises a dual-pole antenna having a vertical feed and a horizontal feed; and
a beam former circuit (i) disposed in said package, (ii) having a plurality of pairs of ports, (iii) configured to generate a plurality of radio-frequency signals in said ports while in a transmit mode and (iv) configured to receive said radio-frequency signals at said ports while in a receive mode, wherein each one of said pairs of said ports is (a) configured to be directly connected to a respective one of said antenna elements and (b) placed in a respective corner of said package to enable isolation of said vertical feeds and said horizontal feeds in a single conductive plane of said antenna array.

18. The apparatus according to claim 17, wherein said pairs of said ports are symmetrically arranged around said package.

19. The apparatus according to claim 17, wherein (i) said apparatus comprises a plurality of said beam former circuits and (ii) said beam former circuits and said antenna elements are configured to implement part of a two-dimensional antenna network.

20. The apparatus according to claim 17, wherein said package comprises (i) a first dimension less than a half-wavelength of said radio-frequency signals and (ii) a second dimension less than said half-wavelength of said radio-frequency signals.

* * * * *